(12) United States Patent
Fey et al.

(10) Patent No.: US 7,071,546 B2
(45) Date of Patent: Jul. 4, 2006

(54) SPACE-SAVING PACKAGING OF ELECTRONIC CIRCUITS

(75) Inventors: Kate E. Fey, Valenica, CA (US); Charles L. Byers, Canyon Country, CA (US); Lee J. Mandell, West Hills, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 127 days.

(21) Appl. No.: 10/345,013

(22) Filed: Mar. 12, 2003

(65) Prior Publication Data

US 2003/0192171 A1 Oct. 16, 2003

(51) Int. Cl.
*H01L 23/02* (2006.01)

(52) U.S. Cl. .................. 257/686; 257/698; 257/777

(58) Field of Classification Search ............. 257/678, 257/685, 686, 787, 698, 777
See application file for complete search history.

(56) References Cited

U.S. PATENT DOCUMENTS

| | | | |
|---|---|---|---|
| 4,304,624 A | 12/1981 | Carson et al. | |
| 4,352,715 A | 10/1982 | Carson et al. | |
| 4,354,107 A | 10/1982 | Carson et al. | |
| 4,383,174 A * | 5/1983 | Matsumura et al. | 250/338.3 |
| 4,403,238 A | 9/1983 | Clark | |
| 4,525,921 A | 7/1985 | Carson et al. | |
| 4,551,629 A | 11/1985 | Carson et al. | |
| 4,646,128 A | 2/1987 | Carson et al. | |
| 4,672,737 A | 6/1987 | Carson et al. | |
| 4,675,532 A | 6/1987 | Carson | |
| 4,706,166 A | 11/1987 | Go | |
| 4,764,846 A | 8/1988 | Go | |
| 4,912,545 A | 3/1990 | Go | |
| 4,956,694 A | 9/1990 | Eide | |
| 4,983,533 A | 1/1991 | Go | |
| 5,104,820 A | 4/1992 | Go et al. | |
| 5,229,647 A | 7/1993 | Gnadinger | |
| 5,279,991 A | 1/1994 | Minahan et al. | |
| 5,293,071 A | 3/1994 | Erdos | |
| 5,313,096 A | 5/1994 | Eide | |
| 5,347,428 A | 9/1994 | Carson et al. | |
| 5,406,701 A | 4/1995 | Pepe et al. | |
| 5,424,920 A | 6/1995 | Miyake | |
| 5,432,729 A | 7/1995 | Carson et al. | |
| 5,528,457 A | 6/1996 | Hawke et al. | |
| 5,581,498 A | 12/1996 | Ludwig et al. | |
| 5,612,570 A | 3/1997 | Eide et al. | |
| 5,688,721 A | 11/1997 | Johnson | |
| 5,701,233 A | 12/1997 | Carson et al. | |
| 5,745,631 A | 4/1998 | Reinker | |

(Continued)

FOREIGN PATENT DOCUMENTS

JP 358092230 * 6/1983

*Primary Examiner*—Mary Wilczewski
*Assistant Examiner*—Monica Lewis
(74) *Attorney, Agent, or Firm*—Gary D. Schnittgrund

(57) ABSTRACT

An apparatus and packaging method for stacking a plurality of integrated circuit substrates, i.e., substrates having integrated circuits formed as integral portions of the substrates, which provides interconnection paths through the substrates to simplify electrical connections between the integrated circuits while facilitating minimization of the volume and customization of the three dimensional package size to conform to the available internal space within a housing, e.g., one used in an implantabie device where package volume is at a premium. Furthermore, an internal cavity can be created by the stacked formation that is suitable for mounting of a surface mount device, e.g., a crystal or the like.

17 Claims, 6 Drawing Sheets

U.S. PATENT DOCUMENTS

| | | | |
|---|---|---|---|
| 5,750,926 A * | 5/1998 | Schulman et al. | 174/52.3 |
| 5,869,353 A | 2/1999 | Levy et al. | |
| 5,898,217 A * | 4/1999 | Johnston | 257/691 |
| 5,953,588 A | 9/1999 | Camien et al. | |
| 6,014,316 A | 1/2000 | Eide | |
| 6,028,352 A | 2/2000 | Eide | |
| 6,072,234 A | 6/2000 | Camien et al. | |
| 6,117,704 A | 9/2000 | Yamaguchi et al. | |
| 6,133,626 A | 10/2000 | Hawke et al. | |
| 6,150,724 A | 11/2000 | Wenzel et al. | |
| 6,164,284 A | 12/2000 | Schulman et al. | |
| 6,185,452 B1 | 2/2001 | Schulman et al. | |
| 6,208,894 B1 | 3/2001 | Schulman et al. | |
| 6,222,737 B1 | 4/2001 | Ross | |
| 6,255,726 B1 | 7/2001 | Vindasius et al. | |
| 6,259,937 B1 | 7/2001 | Schulman et al. | |
| 6,271,478 B1 * | 8/2001 | Horiuchi et al. | 174/255 |
| 6,313,522 B1 * | 11/2001 | Akram et al. | 257/686 |
| 6,314,013 B1 | 11/2001 | Ahn et al. | |
| 6,315,721 B1 | 11/2001 | Schulman et al. | |
| 6,333,562 B1 | 12/2001 | Lin | |
| 6,362,525 B1 | 3/2002 | Rahim | |
| 6,404,043 B1 | 6/2002 | Isaak | |
| 6,472,991 B1 | 10/2002 | Schulman et al. | |
| 6,531,338 B1 | 3/2003 | Akram et al. | |
| 6,560,109 B1 | 5/2003 | Yamaguchi et al. | |
| 6,577,013 B1 * | 6/2003 | Glenn et al. | 257/777 |
| 2001/0039374 A1 | 11/2001 | Schulman | |
| 2004/0061232 A1 | 4/2004 | Shah et al. | |
| 2004/0061234 A1 | 4/2004 | Shah et al. | |

* cited by examiner

SPACE-SAVING PACKAGING OF ELECTRONIC CIRCUITS

FIELD OF THE INVENTION

The present invention is generally directed to packaging techniques for electronic circuitry and in particular vertical stacking and interconnection techniques for a plurality of integrated circuits.

BACKGROUND OF THE INVENTION

Complex electronic devices typically require a large number of transistors, large enough that a single integrated circuit may not be able to perform all of the needed (or desired) functions. Accordingly, such devices are typically fabricated from a plurality of integrated circuit chips that are then interconnected via a motherboard or the like, e.g., a hybrid circuit. While the use of flip chips and BGAs (ball grid arrays) are known for simplifying interconnection between the chips (along with wire bonds), such interconnection techniques can use up valuable and sometimes limited internal package volume. For example, U.S. Pat. Nos. 6,164,284; 6,185,452; 6,208,894; 6,315,721; and 6,472,991; and copending, commonly-assigned U.S. patent application Ser. Nos. 09/677,384; 10/205,862; and 10/280,841 describe implantable medical devices and enclosed circuitry that are sized so that they are suitable for injection in a patient's body, i.e., being contained within an elongated housing having an axial dimension of less than 60 mm and a lateral dimension of less than 6 mm. With such limited outer dimensions (and accordingly even smaller inner dimensions), the space available for needed circuitry is limited. Accordingly, various forms of stacking (sometimes referred to as 3D or vertical integration) techniques have been proposed. Typically, such techniques require a frame (see, e.g., U.S. Pat. No. 6,404,043), interconnect paths at the edge of uniformly sized chips and/or carriers (see, e.g., U.S. Pat. No. 4,956,694), or additional vertical interconnect members and/or wire bond interconnects (see, e.g., U.S. Pat. No. 6,133,626) to extend the assembly beyond two oppositely oriented flip chips, i.e., with one chip facing "up" and the other chip facing "down" so that their BGAs can mate to each other. It is believed that each of these techniques limit the use of valuable package volume.

SUMMARY OF THE INVENTION

The present invention is directed to a packaging technique for stacking a plurality of integrated circuit substrates which provides interconnection paths through the substrates to simplify electrical connections between the integrated circuits while facilitating minimization of the volume and customization of the three dimensional package size to conform to the available internal space within a housing, e.g., one used in an implantable device where package volume is at a premium. Furthermore, an internal cavity can be created by the stacked formation that is suitable for mounting of a surface mount device, e.g., a crystal or the like.

A preferred embodiment of a chip stack, for forming a circuit of a plurality of integrated circuits formed on discrete substrates, is comprised of: (1) a first substrate having first and second faces and a first integrated circuit having one or more interconnection pads formed proximate to the first face of the first integrated circuit, wherein the substrate additionally comprises a plurality of interconnection pathways selected from the set of vias that pass directly through from the first face to the second face of the first substrate, vias that pass in a step-wise manner from the first face to the second face of the first substrate, and vias that pass from one or more of the first integrated circuit interconnection pads to pads at the second surface of the first substrate; (2) a second substrate having first and second faces and a second integrated circuit having one or more interconnection pads formed proximate to the first face of the second integrated circuit, wherein the substrate additionally comprises a plurality of interconnection pathways selected from the set of vias that pass directly through from the first face to the second face of the second substrate, vias that pass in a step-wise manner from the first face to the second face of the second substrate, and vias that pass from one or more of the second integrated circuit interconnection pads to pads at the second surface of the second substrate; and wherein one or more of the interconnection pathways from the first substrate to the second substrate enable electrical interconnection between the first integrated circuit to the second integrated circuit when the first and second substrates are vertically stacked.

In a further feature of preferred embodiments of the present invention, the chip stack may include a plurality of differently-sized substrates stacked in an order to form a stacked shape having a non-rectangular cross section, e.g., essentially round, diamond, triangular, hexagonal, etc., and this 3D configuration facilitates optimal use of available space within a housing, e.g., an elongated housing having an axial dimension of less than 60 mm and a lateral dimension of less than 6 mm.

In a still further significant feature of preferred embodiments of the present invention, the chip stack may be configured to form a cavity within to contain and protect a surface mount device, e.g., a crystal or the like.

The novel features of the invention are set forth with particularity in the appended claims. The invention will be best understood from the following description when read in conjunction with the accompanying drawings.

DETAILED DESCRIPTION OF THE PREFERRED EMBODIMENTS

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to a packaging technique for stacking a plurality of integrated circuit substrates which provides interconnection paths through the substrates to simplify electrical connections between the integrated circuits while facilitating minimization of the volume and customization of the three dimensional package size to conform to the available internal space within a housing, e.g., one used in an implantable device where package volume is at a premium. Furthermore, an internal cavity can be created by the stacked formation that is suitable for mounting of a surface mount device, e.g., a crystal or the like. Advantageously, by forming a circuit system or subsystem out of a plurality of integrated circuits different fabrication techniques and technologies may be used. By using different fabrication technologies, different types of transistors, e.g., bipolar, CMOS, etc., can be mixed while optimally using the advantages of each. Additionally, the yield can be optimized by partitioning the circuitry into smaller, more easily fabricated portions. Finally, different technologies and portions of the circuitry may generate more noise, e.g., output drivers, and others may be more sensitive, e.g., communication circuitry, to generated noise. Accordingly, partitioning the circuitry into different chips that are then stacked, allows the quantity, source and location of noise sources to be controlled.

Figure 1:
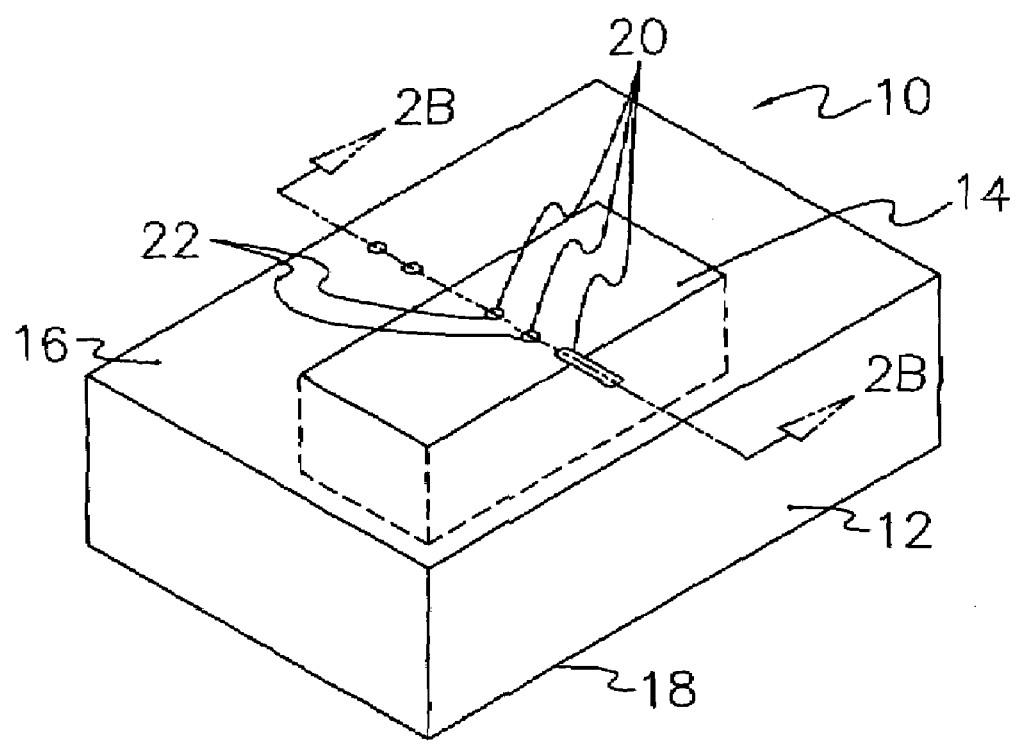
FIG. 1 is a perspective view of one chip stack portion, i.e., layer, of a chip stack comprised of a substrate having an integrated circuit formed integral to a first, e.g., upper, face and interconnection pathways from the integrated circuit to a second, e.g., lower, face of the substrate.

As shown in FIG. 1, a first chip stack portion 10 is comprised of a semiconductor substrate 12 having an integrated circuit 14 formed on a first face 18 opposite a second face 18. Additionally, as shown in U.S. Pat. No. 6,259,937 and commonly-assigned copending U.S. patent application Ser. No. 09/882,712, filed Jun. 14, 2001 and published on Nov. 8, 2001 as U.S. Patent Application Publication No. 2001/0039374, now U.S. Pat. No. 6,516,808, (each of which is incorporated herein by reference in their entirety) vias may be formed from the first face 16 to the second face 18 of the semiconductor substrate 12, preferably such that the vias connect from interconnection pads 20 on the face of the integrated circuit 14 to the second face 18 of the semiconductor substrate 12 or to other portions of the first face 16 of the semiconductor substrate 12.

It should be noted that the actual height of each chip stack portion, i.e., its Z direction vertical dimension, is fairly thin as compared to its horizontal widths, i.e., its X and Y dimensions. However, the drawings presented are purposely exaggerated to allow its Z direction details, e.g., the integrated circuit and vias, to be shown more clearly.

Figure 2A:
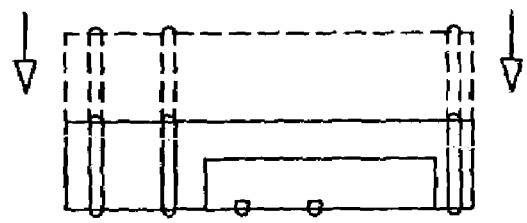
FIG. 2A is a cross sectional view of chip stack portion that is flipped, i.e., having its integrated circuit face and associated ball grid array interconnects primarily on its lower face. Additionally, this Figure shows lapping to facilitate the formation of vias through the substrate and the thinning of the stack portion.
Figure 2B:
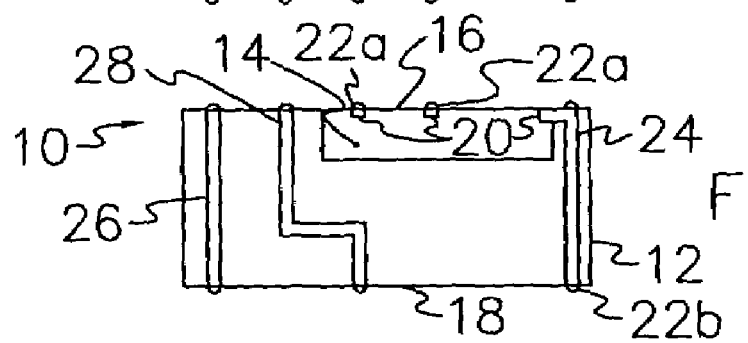
FIG. 2B is a cross sectional view of the chip stack portion of FIG. 1 taken along the line 2B—2B.

FIG. 2B shows a cross sectional view of the chip stack portion of FIG. 1 taken along the line 2B—2B. With this cross sectional view, one can see various interconnection variants that are used in embodiments of the present invention. For example, bumps 22a, e.g., formed from gold, solder, aluminum, etc., may be formed on interconnection pads 20 to form a portion of a ball grid array for interconnection to other chip stack portions 10. Alternatively, a via 24 may be formed from interconnection pad 20 in a stair case, e.g., serpentine, manner from the interconnection pad 20 on the first face 16 to the second face 18. Optionally, bump 22b may be formed at the second face end of the via 24. Additionally, vias 26 and 28 may be formed in the semiconductor substrate 12 to allow interconnection pathways from the first face 16 to the second face of the semiconductor substrate 12. Via 26 is an essentially straight through feedthrough while via 28 uses a stair case, e.g., serpentine, pathway through the semiconductor substrate 12. By using combinations of these interconnection pathways selected from the set of vias that pass directly through from the first face 16 to the second face 18 of the substrate 12 (e.g., via 26), vias that pass in a step-wise manner from the first face 16 to the second face 18 of the substrate 12 (e.g., via 28), and vias that pass from one or more of the integrated circuit interconnection pads 20 to bumps 22b at the second face 18 of the substrate 12 (e.g., via 24), a stack of integrated circuits 14 located on discrete semiconductor substrates 12 can be formed with electrical interconnection paths between the integrated circuits 14 and external pathways when a plurality of such chip stack portions 10 are coupled together using solder, thermal compressive bonding, ultrasonic bonding, conductive epoxy, and the like to establish the electrical and mechanical interconnections of the chip stack.

The vias, e.g., 24, 26 and 28, are preferably formed by masking the surface of the substrate 12, i.e., a silicon wafer, except where the vias are to be positioned and these positions are etched to a depth of at least 10 microns plus an additional depth to allow for an insulation layer. The sidewalls of the etched wells are preferably not vertical, but instead are formed having a sufficient angle such that subsequent conductor material deposition will fill them completely. Next, the surface 16 including the etched wells are coated with an appropriate insulating layer such as silicon dioxide. Then, a conducting material such as metal is deposited on the substrate 12 with sufficient depth to fill the wells completely. Now, all the conducting material is removed from the substrate 12 except in the holes and the integrated circuit 14 (which is formed of layers which are built up on the surface 16 of the substrate 12 in the standard manner of integrated circuit (IC) fabrication) with the circuit 14 connected to the vias, e.g., 24, as appropriate. Finally, the substrate 12 is thinned, i.e., lapped, by diamond grinding from the back side to a thickness of 10 microns, exposing the bottom of the wells as bonding pads for solder or gold bumping.

Figure 2C:
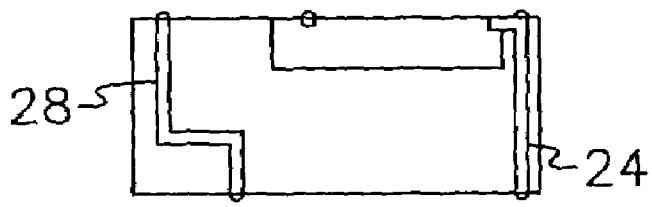
FIG. 2C is another chip stack portion.
Figure 2D:
FIG. 2D is a substrate that is used solely for providing interconnection pathways, i.e., without an integral integrated circuit, between its top and bottom surfaces to thereby provide additional interconnects between chip stack portions.
Figure 2E:
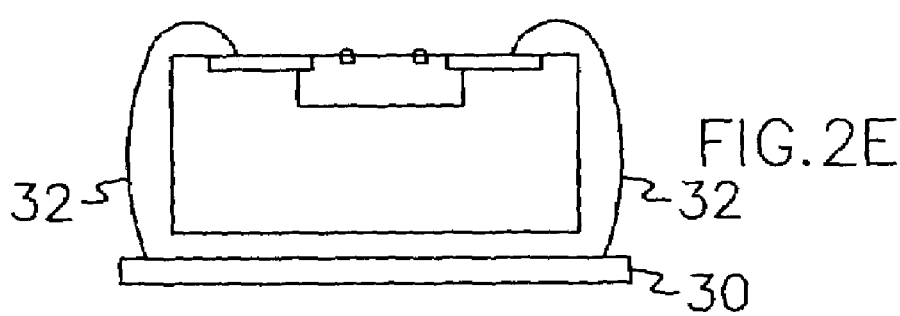
FIG. 2E is another chip stack portion and an optional motherboard with wire bond interconnects therebetween.

Other variants of the chip stack portions are also within the scope of the present invention. For example, FIG. 2A is essentially a flip chip, i.e., the same configuration of FIGS. 1 and 2B with a 180 degree reversal. However, note that the chip stack portion of FIG. 2A is intentionally made thinner by the aforementioned lapping process performed to the non active side, i.e., the side opposite the integrated circuit portion to reduce the chips stack portion's, i.e., layer's, thickness toward the dotted line shown. FIG. 2C is similar to that previously described with less via permutations and FIG. 2E is similar to what has been described in reference to FIG. 2B with the exception that an optional motherboard 30 and wire bonds 32 are used to supplement the interconnection scheme. In some embodiments, it may be difficult to obtain all of the required interconnections. In such cases, an interconnect chip stack portion 34 (see FIG. 2D) may be used which is similar to that previously described in reference to FIG. 2B with the primary difference being that an integrated circuit is not formed on the semiconductor substrate 12.

Figure 3:
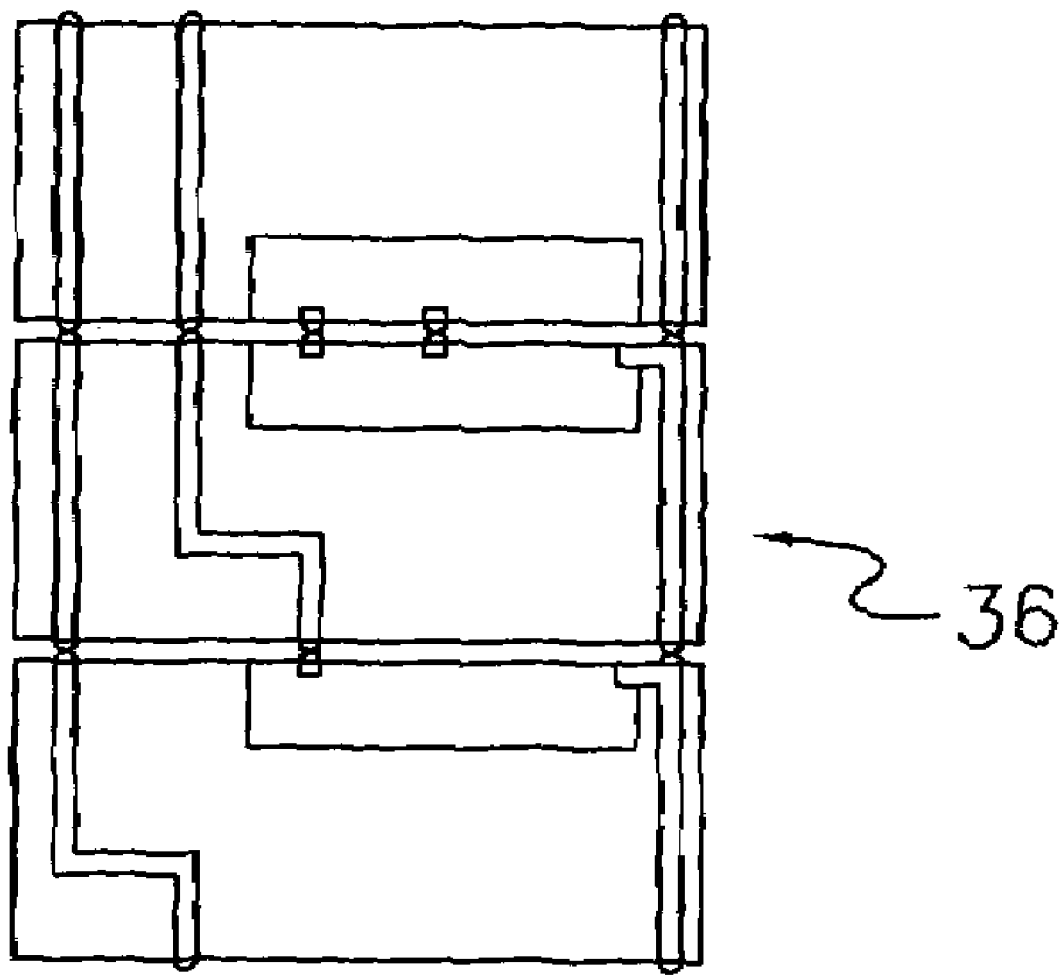
FIG. 3 is the cross sectional view of the exemplary chip stack of FIGS. 2A–2C, after mating.
Figure 4:
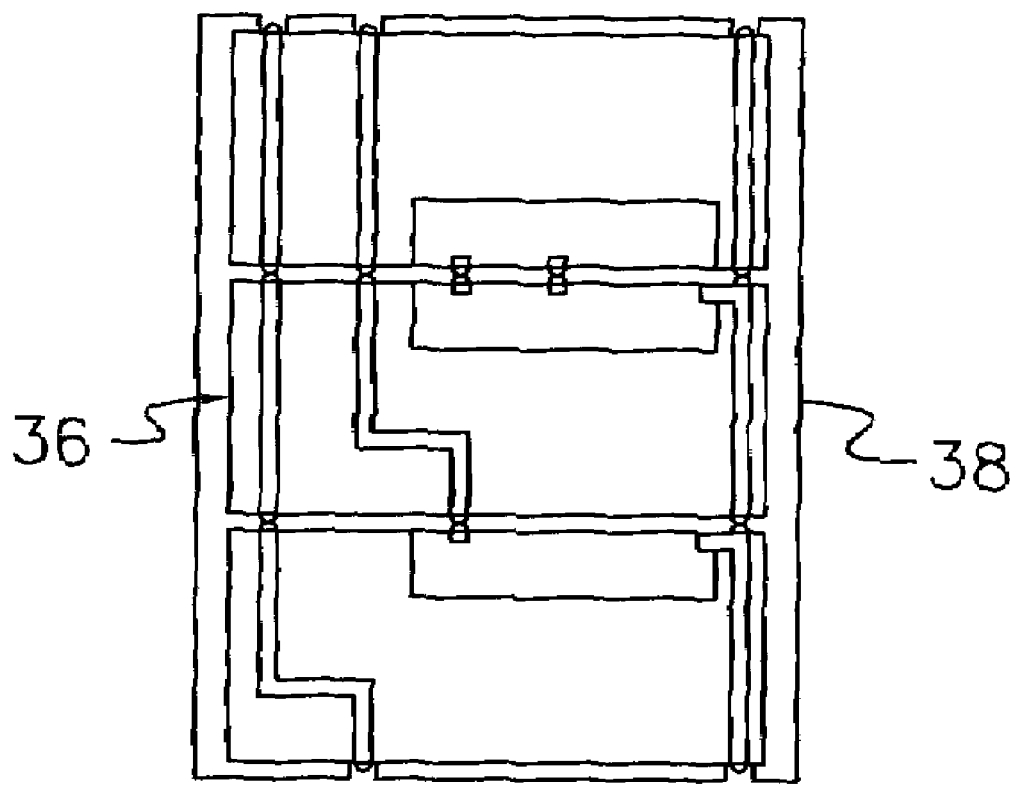
FIG. 4 is the exemplary chip stack of FIGS. 2A–2C with encapsulation of the chip portions (with the exception of interconnect pads that are used for external connections).

FIG. 3 shows a chip stack 36 of the present invention comprised of a plurality of chip stack portions 10, i.e., in this example, just those shown in FIGS. 2A–2C, after they have been electrically and mechanically bonded together to form a combination of integrated circuits that thus form a system or subsystem. This chip stack 36 may then be mounted within a housing (not shown). Alternatively, the chip stack 36 may be encapsulated (see FIG. 4), e.g., with alumina or the like, to enable the chip stack 36 to be directly implanted within a patient's body since it is within encapsulation layer 38 (see, for example, U.S. Pat. No. 6,259,937 which describes such an environment and methods of depositing an encapsulation layer, e.g., by ion beam deposition (IBD)).

Figure 5:
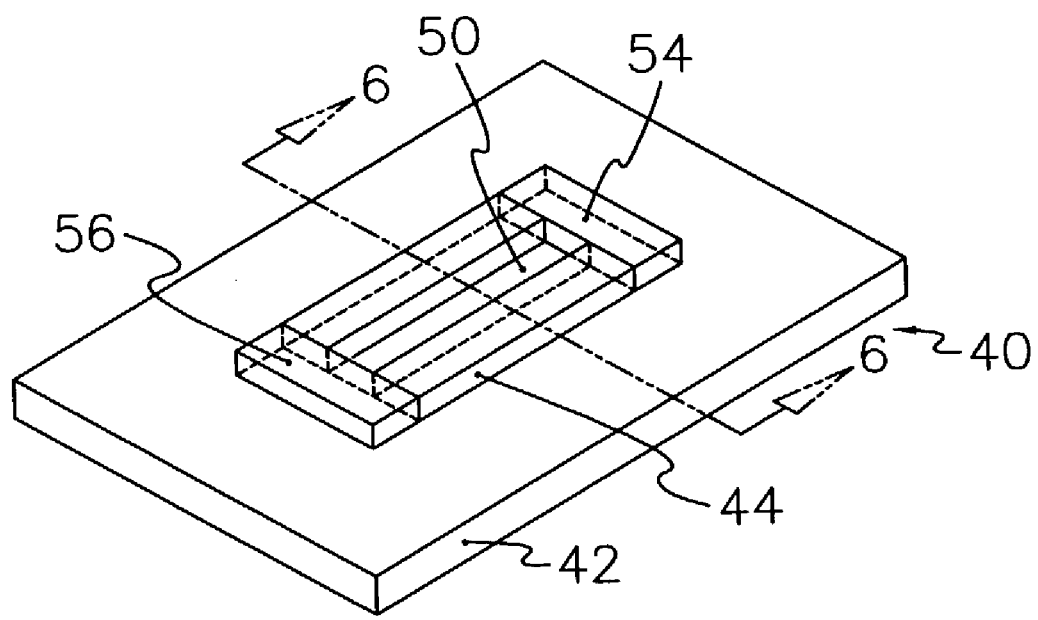
FIG. 5 is a perspective view of the first two chip portions, i.e., layers, of a chip stack where an optional cavity is formed within that is suitable for containing a surface mount device, e.g., a piezoelectric device, a capacitor, etc.
Figure 6:
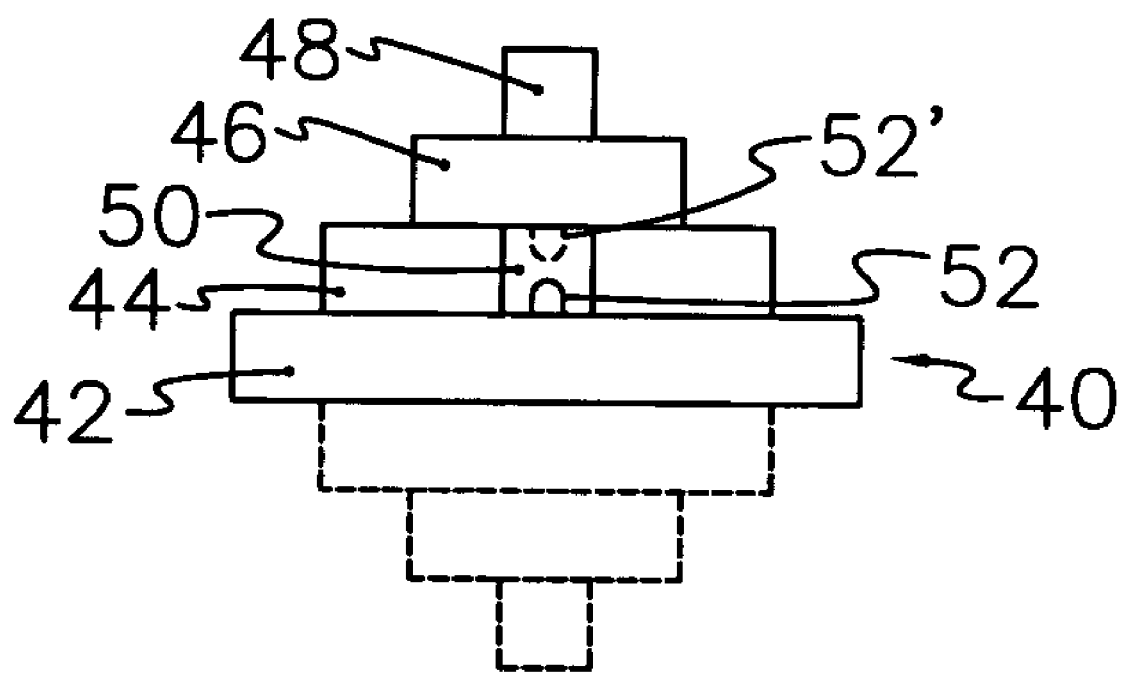
FIG. 6 is a cross-sectional view of a further extended chip stack of FIG. 5, taken along the line 6—6, wherein a cavity is optionally formed within, suitable for encasing a surface mount device. Additionally, this configuration demonstrates the capability of embodiments of the present invention to form the three dimensional stack with a non-rectangular cross section.

FIG. 5 is a perspective view of the first two layers of a chip stack 40 where differently-sized chip stack portions 42, 44 are purposely used in order to form a chip stack 40 which conforms with the available volume in a housing, e.g., the elongate housing described relative to commonly-assigned U.S. Pat. Nos. 6,164,284; 6,185,452; 8,208,894; 6,315,721; and 6,472,991; each of which is incorporated herein by reference in their entirety. (Note that the vias and integrated circuits are purposely not shown in these FIGS. 5 and 6 for simplification purposes.) Accordingly, as shown in FIG. 6 (which is a cross-sectional view of a further extended chip stack of FIG. 5, taken along the line 6—6 and adding chip stack portions 46, 48), selecting additional chip stack portion sizes allows one to form a desired three dimensional shape. For example, if all of the semiconductor substrates were equally sized, a rectangular cross sectional shape would result. However, as demonstrated in FIG. 6, a non-rectangular cross section can be achieved, e.g., circular, semicircular, triangular, diamond, hexagonal, etc., or whatever shape is required to conform to the available internal volume (note the optional dotted portions shown to transform the shape from a triangle to a diamond). For example, while a preferred cross section for implantable devices formed according to U.S. Pat. Nos. 6,164,284; 6,185,452; 6,208,894; 6,315,721; and 6,472,991 is typically round, square, diamond, triangular, hexagonal, and other shapes are also possible and embodiments of the present invention thus allow optimal use of the internal package space.

Optionally, a cavity 50 may be formed within that is suitable for containing a surface mount device 52, e.g., a piezoelectric device (including crystals and the like as described in copending, commonly-assigned, concurrently-filed U.S. patent application Ser. No. 10/342,825 entitled "Piezoelectric Devices Mounted On An Integrated Circuit Chip" which is incorporated herein by reference in its entirety), a capacitor, etc., by design and selective placement of chip stack portions, i.e., layers, that form the cavity 50 within. Advantageously, this configuration enables the surface mount device 52, e.g., a crystal to be protected from external contact by the surrounding semiconductor chip stack portions. Additionally, chip stack portions 54, 56 (see FIG. 5) may be utilized to completely surround the cavity 50 and may, with assistance of an encapsulation layer, e.g., alumina, be used to hermetically encase such surface mount devices 52 within the chip stack 40.

Accordingly, what has been shown is an apparatus and packaging method for stacking a plurality of chips that facilitates the optimal use of internal packaging space. While the invention has been described by means of specific embodiments and applications thereof, it is understood that numerous modifications and variations could be made thereto by those skilled in the art without departing from the spirit and scope of the invention. It is therefore to be understood that within the scope of the claims, the invention may be practiced otherwise than as specifically described herein.

What is claimed is:

1. A chip stack for forming a circuit of a plurality of integrated circuits formed on discrete semiconductor substrates, said chip stack comprising:

a first semiconductor substrate having first and second faces and an integrally formed first integrated circuit having one or more interconnection pads formed proximate to said first face of said first semiconductor substrate, wherein said first semiconductor substrate additionally comprises a plurality of electrical interconnection pathways selected from the set of electrically conductive vias that pass directly through from said first face to said second face of said first semiconductor substrate, electrically conductive vias that pass internally in a step-wise manner from said first face to said second face of said first semiconductor substrate, and electrically conductive vias that pass from one or more of said first integrated circuit interconnection pads to pads at said second surface of said first semiconductor substrate;

a second semiconductor substrate having first and second faces and an integrally formed second integrated circuit having one or more interconnection pads formed proximate to said first face of said second semiconductor substrate, wherein said second semiconductor substrate additionally comprises a plurality of electrical interconnection pathways selected from the set of electrically conductive vias that pass directly through from said first face to said second face of said second semiconductor substrate, electrically conductive vias that pass internally in a step-wise manner from said first face to said second face of said second semiconductor substrate, and electrically conductive vias that pass from one or more of said second integrated circuit interconnection pads to pads at said second surface of said second semiconductor substrate;

one or more of said interconnection pathways from said first semiconductor substrate to said second semiconductor substrate enable electrical interconnections between said first integrated circuit to said second integrated circuit when said first and second semiconductor substrates are vertically stacked; and wherein at least one of said interconnection pathways is comprised of an electrically conductive via that passes internally through at least one of said semiconductor substrates in a step-wise manner.

2. The chip stack of claim 1 wherein said stack of semiconductor substrates are encapsulated with a coating to hermetically seal said integrated circuits contained within.

3. The chip stack of claim 2 wherein said encapsulation is alumina.

4. The chip stack of claim 2 wherein said hermetically sealed stack is suitable for implantation in a patient's body.

5. The chip stack of claim 1 additionally comprising:
a third semiconductor substrate having first and second faces and an integrally formed third integrated circuit having one or more interconnection pads formed proximate to said first face of said third semiconductor substrate, wherein said third semiconductor substrate additionally comprises a plurality of electrical interconnection pathways selected from the set of electrically conductive vias that pass directly through from said first face to said second face of said third semiconductor substrate, electrically conductive vias that pass in a step-wise manner from said first face to said second face of said third semiconductor substrate, and electrically conductive vias that pass from one or more of said third integrated circuit interconnection pads to pads at the third surface of said third semiconductor substrate; and wherein
one or more of said interconnection pathways from said third semiconductor substrate to said second semiconductor substrate enable electrical interconnections between said third integrated circuit to integrated circuits selected from the set of said first and said second integrated circuits when said first, second, and third semiconductor substrates are vertically stacked.

6. The chip stack of claim 5 wherein said stack of semiconductor substrates are encapsulated with a coating to hermetically seal said integrated circuits contained within.

7. The chip stack of claim 5 additionally comprising:
a fourth semiconductor substrate having first and second faces, wherein said fourth semiconductor substrate additionally comprises a plurality of electrical interconnection pathways selected from the set of electrically conductive vias that pass directly through from said first face to said second face of said fourth semiconductor substrate, and electrically conductive vias that pass in a step-wise manner from said first face to said second face of said fourth semiconductor substrate; and wherein
said fourth semiconductor substrate is used within a chip stack of at least said first and said second semiconductor substrates to facilitate electrical interconnections between said first and said second integrated circuits.

8. The chip stack of claim 7 wherein said stack of semiconductor substrates are encapsulated with a coating to hermetically seal said integrated circuits contained within.

9. The chip stack of claim 1 wherein said semiconductor substrates are essentially uniform in size.

10. The chip stack of claim 1 wherein said stack is formed of a plurality of differently-sized semiconductor substrates stacked in an order to form a stacked shape having a non-rectangular cross section.

11. The chip stack of claim 10 wherein said stacked shape is configured to facilitate placement within a housing.

12. The chip stack of claim 10 wherein said stacked shape is configured to facilitate placement within an elongated housing having an axial dimension of less than 60 mm and a lateral dimension of less than 6 mm.

13. The chip stack of claim 10 wherein said stack is formed of a plurality of differently-sized semiconductor substrates stacked in order to form a stacked shape having an essentially non-rectangular cross section selected from the set of circular, semi-circular, triangular, diamond, and hexagonal cross sections.

14. The chip stack of claim 1 wherein said stack is formed of a plurality of differently-sized semiconductor substrates stacked in order to cause a cavity to be formed within the chip stack, and wherein one or more surface mount devices are mounted on a face of at least one of the semiconductor substrate within said cavity.

15. The chip stack of claim 14 wherein said surface mount devices are selected from the set of piezoelectric devices and capacitors.

16. The chip stack of claim 14 wherein at least one surface mount device comprises a crystal mounted on a face of at least one of the semiconductor substrate faces within said cavity.

17. The chip stack of claim 14 wherein said stack of semiconductor substrates are encapsulated with a coating to hermetically seal said integrated circuits contained within.

* * * * *